(12) United States Patent
Nojima

(10) Patent No.: US 7,915,957 B2
(45) Date of Patent: Mar. 29, 2011

(54) DISTRIBUTED AMPLIFICATION APPARATUS AND AMPLIFIER

(75) Inventor: Shuji Nojima, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/752,838

(22) Filed: Apr. 1, 2010

(65) Prior Publication Data

US 2010/0253434 A1 Oct. 7, 2010

Related U.S. Application Data

(63) Continuation of application No. PCT/JP2008/002777, filed on Oct. 2, 2008.

(30) Foreign Application Priority Data

Oct. 22, 2007 (JP) ................................. 2007-274282

(51) Int. Cl.
*H03F 3/60* (2006.01)
(52) U.S. Cl. ........................................ 330/286; 330/295
(58) Field of Classification Search .................... 330/53, 330/54, 286, 295, 311
See application file for complete search history.

(56) References Cited

U.S. PATENT DOCUMENTS

| 4,291,286 A | * | 9/1981 | Wagner | ........................... 330/286 |
| 5,227,734 A | * | 7/1993 | Schindler et al. | ............. 330/286 |
| 6,377,125 B1 | * | 4/2002 | Pavio et al. | ................... 330/286 |
| 6,400,226 B2 | * | 6/2002 | Sato | .............................. 330/286 |
| 2001/0002803 A1 | | 6/2001 | Sato | |

FOREIGN PATENT DOCUMENTS

| JP | 2-182006 A | 7/1990 |
| JP | 4-317206 A | 11/1992 |
| JP | 11-41042 A | 2/1999 |
| JP | 11-88079 A | 3/1999 |
| JP | 2001-160723 A | 6/2001 |
| JP | 2005-109842 A | 4/2005 |
| JP | 2006-41936 A | 2/2006 |

OTHER PUBLICATIONS

International Search Report (ISR) issued in PCT/JP2008/002777 (parent application).
Written Opinion (PCT/ISA/237) issued in PCT/JP2008/002777 (parent application).

* cited by examiner

*Primary Examiner* — Khanh V Nguyen
(74) *Attorney, Agent, or Firm* — Chen Yoshimura LLP

(57) ABSTRACT

Provided is a distributed amplification apparatus that outputs an output signal obtained by amplifying an input signal input thereto, comprising an input-side transmission line that transmits the input signal; an output-side transmission line that transmits the output signal; and a plurality of amplifiers that are provided in parallel between the input-side transmission line and the output-side transmission line, the amplifiers each amplifying the input signal transmitted on the input-side transmission line and supplying the amplified signal to the output-side transmission line. Each amplifier includes a transistor; a capacitor provided on a line that transmits the input signal to a gate terminal of the transistor; and a gate-ground resistance that is provided between the gate terminal of the transistor and a ground potential.

4 Claims, 3 Drawing Sheets

DISTRIBUTED AMPLIFICATION APPARATUS AND AMPLIFIER

BACKGROUND

1. Technical Field

The present invention relates to a distributed amplification apparatus and an amplifier.

2. Related Art

A known distribution amplifier is used for amplifying signal voltage in a receiving section of a communication apparatus, as shown in Patent Documents 1 and 2, for example. In a conventional distribution amplifier, a plurality of transistors are arranged in parallel between the input-side signal line and the output-side signal line, and the gate width of each transistor is set based on the amplification rate of the signal voltage.

Patent Document 1: Japanese Patent Application Publication No. 11-88079

Patent Document 2: Japanese Patent Application Publication No. 2006-41936

Furthermore, it is known that a signal with a wider band can be amplified by increasing the number of transistors arranged in parallel between the signal lines to decrease the capacitance between the gate and drain and between the gate and source in each transistor. On the other hand, increasing the number of transistors beyond a certain point causes a greater amount of signal loss, and so there is a limit on the bandwidth that can be amplified.

A known method for restricting the effect that the capacitance between the gate and the source and between the gate and the drain of each transistor exerts on the signal frequency, without increasing the number of transistors, involves providing a capacitor between the transistors and the input-side signal line. With this method, however, a frequency dependency occurs between the input voltage from the input-side signal line and the gate voltage of the transistor.

SUMMARY

Therefore, it is an object of an aspect of the innovations herein to provide a distributed amplification apparatus and an amplifier, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary distributed amplification apparatus may include a distributed amplification apparatus that outputs an output signal obtained by amplifying an input signal input thereto, comprising an input-side transmission line that transmits the input signal; an output-side transmission line that transmits the output signal; and a plurality of amplifiers that are provided in parallel between the input-side transmission line and the output-side transmission line, the amplifiers each amplifying the input signal transmitted on the input-side transmission line and supplying the amplified signal to the output-side transmission line. Each amplifier includes a transistor; a capacitor provided on a line that transmits the input signal to a gate terminal of the transistor; and a gate-ground resistance that is provided between the gate terminal of the transistor and a ground potential.

According to a second aspect related to the innovations herein, one exemplary amplifier may include an amplifier that amplifies an input signal input thereto, comprising a transistor; a capacitor that is provided on a line that transmits the input signal to a gate terminal of the transistor; and a gate-ground resistance that is provided between the gate terminal of the transistor and a ground potential.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, an embodiment of the present invention will be described. The embodiment does not limit the invention according to the claims, and all the combinations of the features described in the embodiments are not necessarily essential to means provided by aspects of the invention.

Figure 1:
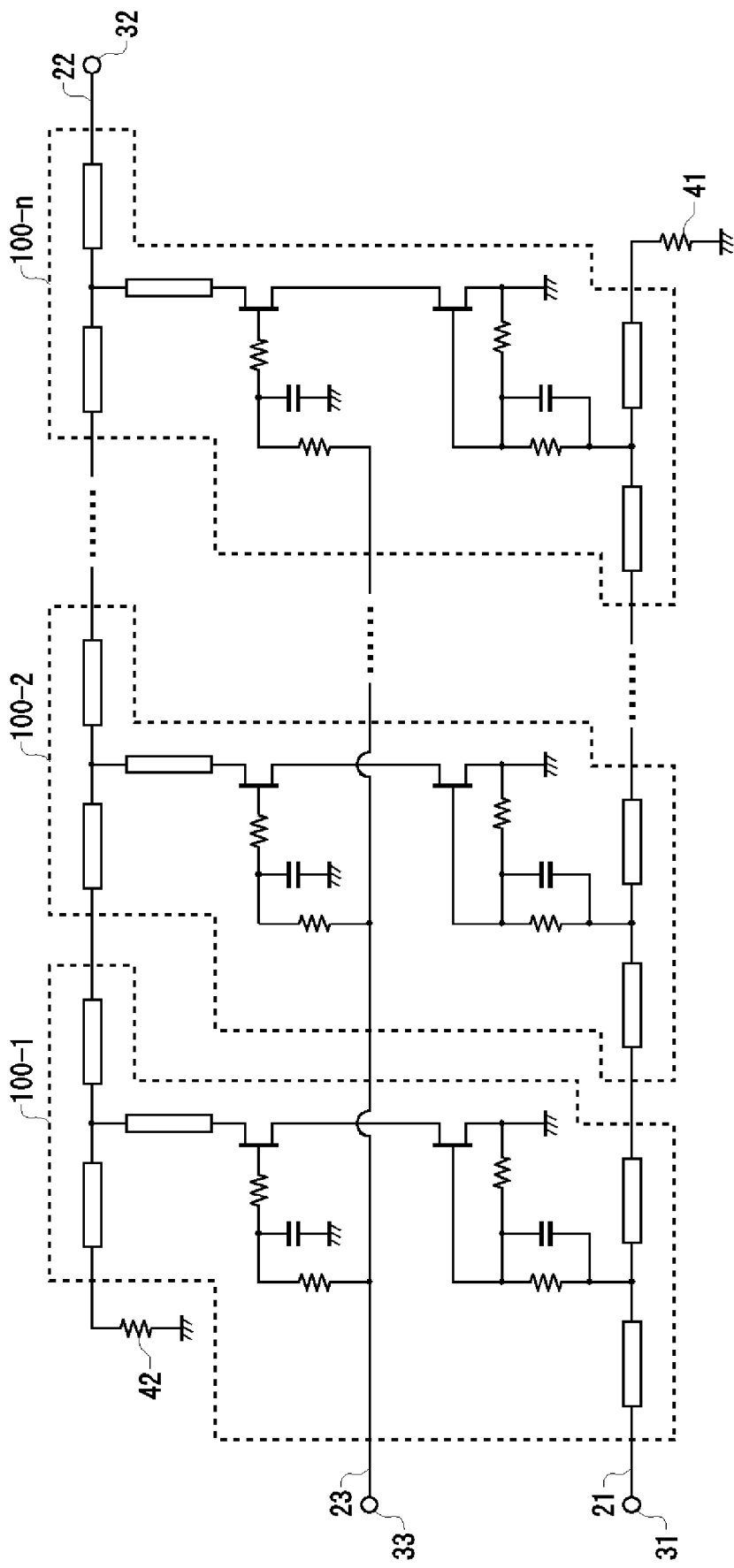
FIG. 1 is a circuit diagram showing an exemplary configuration of a distributed amplification apparatus 10 according to an embodiment of the present invention.

FIG. 1 is a circuit diagram showing an exemplary configuration of a distributed amplification apparatus 10 according to an embodiment of the present invention. As shown in FIG. 1, the distributed amplification apparatus 10 includes an input-side transmission line 21, an output-side transmission line 22, a bias line 23, and a plurality of amplifiers 100-1 to 100-$n$, where n is a natural number. One end of the input-side transmission line 21 has an input terminal 31 for supplying a signal to be amplified by the distributed amplification apparatus 10, and the other end of the input-side transmission line 21 terminates via a termination resistance 41. One end of the output-side transmission line 22 has an output terminal 32 from which is output a signal transmitted on the output-side transmission line 22, and the other end of the output-side transmission line 22 terminates via a termination resistance 42. One end of the bias line 23 has a bias terminal 33, and a bias voltage is supplied from the bias terminal 33 to each of the plurality of amplifiers 100-1 to 100-$n$.

The amplifiers 100-1 to 100-$n$ are provided in parallel between the input-side transmission line 21 and the output-side transmission line 22, and are sequentially connected at uniform intervals therebetween. The amplifiers 100-1 to 100-$n$ each amplify the signal transmitted on the input-side transmission line 21, and supply the amplified signal to the output-side transmission line 22. The signals supplied to the output-side transmission line 22 from the amplifiers 100-1 to 100-$n$ are combined with the same phase while being transmitted on the output-side transmission line 22. In FIG. 1, the rectangular blocks arranged between the input-side transmission line 21 and the output-side transmission line 22 represent inductance components of the transmission lines.

Figure 2:
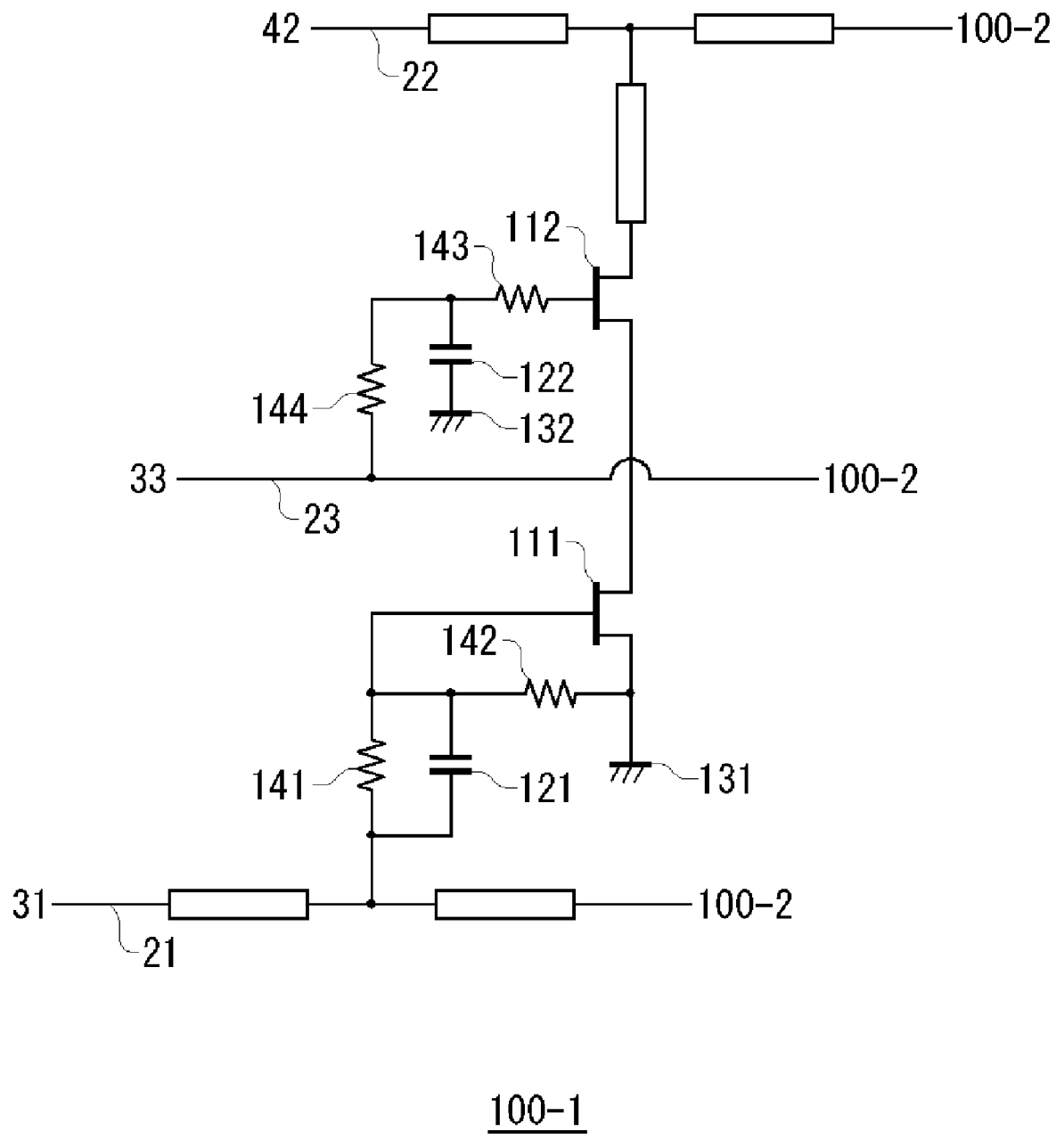
FIG. 2 is a circuit diagram of the amplifier 100-1 extracted from the distributed amplification apparatus 10.

FIG. 2 is a circuit diagram of the amplifier 100-1 extracted from the distributed amplification apparatus 10. The amplifiers 100-2 to 100-$n$ each have the same configuration as the amplifier 100-1, and are therefore not individually described. As shown in FIG. 2, the amplifier 100-1 includes a transistor 111 and a transistor 112 connected in cascade. The source terminal of the transistor 111 is connected to a ground potential 131. The gate terminal of the transistor 111 is connected to the input-side transmission line 21 via a capacitor 121 and a parallel resistance 141, which are provided in parallel.

The drain terminal of the transistor 111 is connected to the source terminal of the transistor 112. A gate-ground resistance 142 is provided between the gate terminal of the transistor 111 and the ground potential 131. The transistor 111 amplifies, by a prescribed amplification rate, the voltage of a signal that is supplied from the input terminal 31 and transmitted on the input-side transmission line 21 to be supplied to the gate terminal, and outputs the amplified signal from the drain terminal.

The gate terminal of the transistor 112 is connected to the bias line 23 via a resistance 143 and a resistance 144, which are provided in series. The drain terminal of the transistor 112 is connected to the output-side transmission line 22. In order to decrease frequency noise that occurs in the bias line 23, a capacitor 122 that is connected to the ground potential 132 is provided between the resistance 143 and the resistance 144. A bias voltage, which enables the transistor 112 to amplify the amplified signal output from the drain terminal of the transistor 111, is supplied from the bias terminal 33 to the gate terminal of the transistor 112 via the bias line 23. As a result, the transistor 112 applies the bias voltage supplied from the bias terminal 33 to the amplified signal that is amplified by the transistor 111 and output from the drain terminal thereof.

Figure 3:
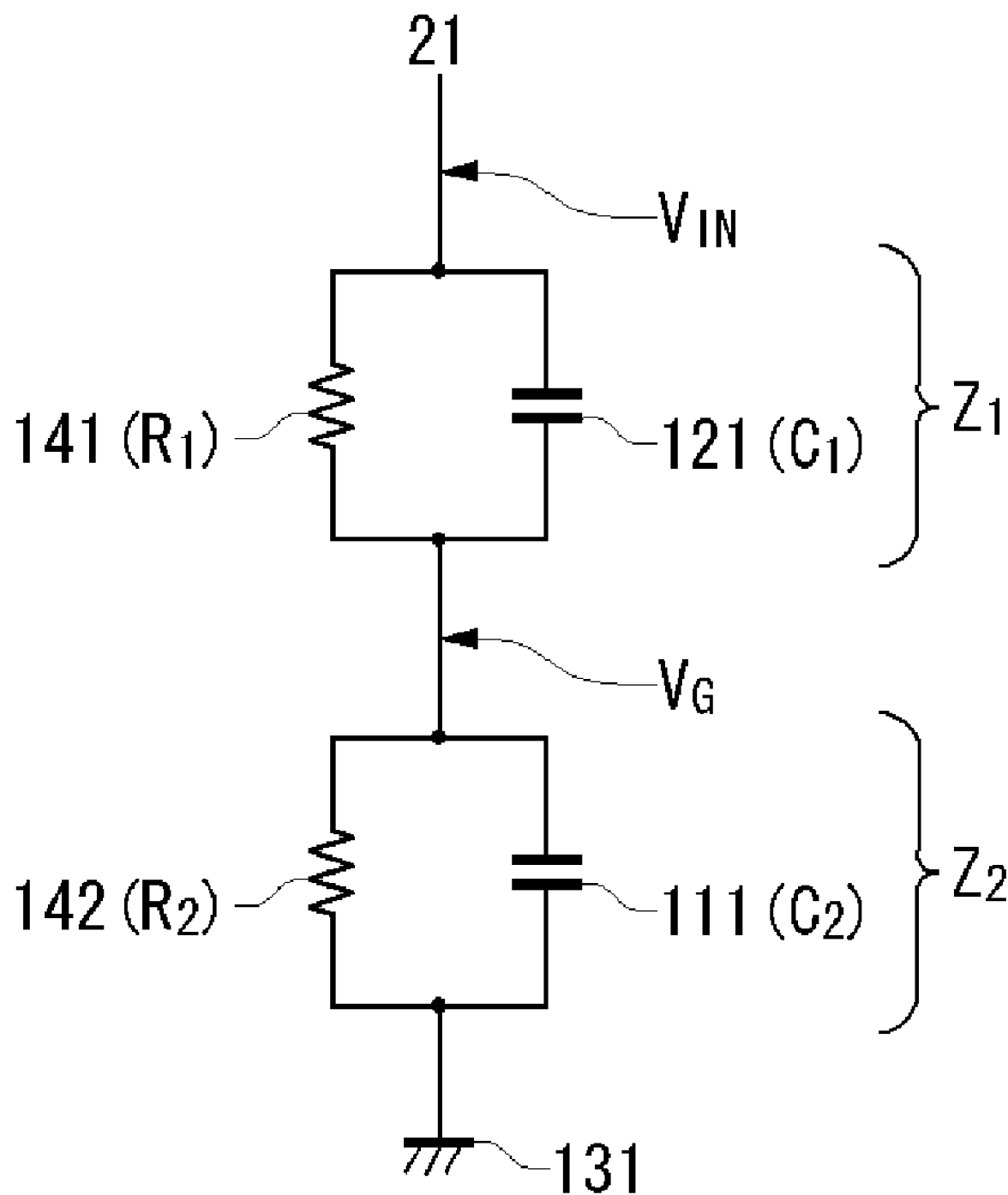
FIG. 3 is a circuit diagram schematically showing the arrangement of the capacitor 121, the parallel resistance 141, the gate-ground resistance 142 and the capacitance and the like between the gate terminal and source terminal of the transistor 111.

FIG. 3 is a circuit diagram schematically showing the arrangement of the capacitor 121, the parallel resistance 141, the gate-ground resistance 142, and the capacitance and the like between the gate terminal and source terminal of the transistor 111. In FIG. 3, for ease of explanation, the circuit symbol indicating the capacitance between the gate terminal and the source terminal of the transistor 111 is the same as the reference numeral used for the transistor 111. In the amplifier 100-1 having the above circuit configuration, the gate-ground resistance 142 and the capacitance (111 in FIG. 3) between the gate terminal and the source terminal of the transistor 111 are arranged in parallel from the perspective of the input-side transmission line 21, the capacitor 121, and the parallel resistance 141.

The above capacitance and the gate-ground resistance 142 are arranged in parallel with each other, and are connected in series with the capacitor 121 and the parallel resistance 141, which are arranged in parallel with each other. Here, when the capacitance of the capacitor 121 is $C_1$, the capacitance between the gate terminal and the source terminal of the transistor 111 is $C_2$, the resistance value of the parallel resistance 141 is $R_1$, and the resistance value of the gate-ground resistance 142 is $R_2$, the impedance $Z_1$ of the ends of the capacitor 121 (or the parallel resistance 141) and the impedance $Z_2$ of the ends of the gate-ground resistance 142 (or the capacitance between the gate terminal and the source terminal of the transistor 111) are defined by the expressions shown below.

$$Z_1 = \frac{1}{1/R_1 + j\omega C_1} \quad \text{Expression 1}$$

$$Z_2 = \frac{1}{1/R_2 + j\omega C_2} \quad \text{Expression 2}$$

Here, j is an imaginary number and ω is the angular frequency of the input voltage from the input-side transmission line 21. When the input voltage from the input-side transmission line 21 to the capacitor 121 and the parallel resistance 141 is $V_{IN}$ and the input voltage to the gate terminal of the transistor 111 is $V_G$, the ratio $V_G/V_{IN}$ is defined by Expression A below.

$$V_G/V_{IN} = Z_2/(Z_1+Z_2) \quad \text{Expression A}$$

Here, when Expressions 1 and 2 are substituted in Expression A, the ratio $V_G/V_{IN}$ can be expressed as shown below.

$$V_G/V_{IN} = \frac{1/R_1 + j\omega C_1}{(1/R_1 + 1/R_2) + j\omega(C_1 + C_2)}$$

Here, the condition for which the ratio $V_G/V_{IN}$ becomes a constant is shown in Expression B below.

$$R_1 \cdot C_1 = C_2 \cdot R_2 \quad \text{Expression B}$$

When the capacitance $C_1$ of the capacitor 121, the capacitance $C_2$ between the gate terminal and source terminal of the transistor 111, the resistance value $R_1$ of the parallel resistance 141, and the resistance value $R_2$ of the gate-ground resistance 142 fulfill the conditions of Expression B, the relationship between the input voltage $V_{IN}$ from the input-side transmission line 21 and the input voltage $V_G$ input to the gate terminal of the transistor 111 is shown by Expression C below.

$$V_G = V_{IN} \cdot R_2/(R_1+R_2) \quad \text{Expression C}$$

In the amplifier 100-1 of the distributed amplification apparatus 10, the circuit elements are arranged to satisfy Expression B, i.e. the circuit elements are arranged such that the product of the capacitance $C_1$ of the capacitor 121 and the resistance value $R_1$ of the parallel resistance 141 is substantially equal to the product of the capacitance $C_2$ between the gate terminal and source terminal of the transistor 111 and the resistance value $R_2$ of the gate-ground resistance 142. Accordingly, as made clear from Expression C, in the amplifier 100-1, the ratio of the input voltage $V_G$ input to the gate terminal of the transistor 111 to the input voltage $V_{IN}$ from the input-side transmission line 21 becomes constant, and does not depend on the frequency of the input voltage.

In the amplifier 100-1 of the distributed amplification apparatus 10, by including the capacitor 121 between the gate terminal of the transistor 111 and the input-side transmission line 21 in this way, the capacitance between the input-side transmission line 21 and the ground potential 131 can be decreased, and furthermore, the ratio of the input voltage $V_G$ input to the gate terminal of the transistor 111 to the input voltage $V_{IN}$ from the input-side transmission line 21 can be kept constant without depending on the frequency of the input voltage $V_{IN}$.

In the distributed amplification apparatus 10 of the present embodiment, the transistors included in the amplifiers 100-1 to 100-n are field effect transistors, but bipolar transistors may be used instead. In such a case, the gate terminal is the base terminal, the source terminal is the emitter terminal, and the drain terminal is the collector terminal.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A distributed amplification apparatus that outputs an output signal obtained by amplifying an input signal input thereto, comprising:
    an input-side transmission line that transmits the input signal;
    an output-side transmission line that transmits the output signal; and
    a plurality of amplifiers that are provided in parallel between the input-side transmission line and the output-side transmission line, the amplifiers each amplifying the input signal transmitted on the input-side transmission line and supplying the amplified signal to the output-side transmission line,
    wherein each amplifier includes:
    a transistor;
    a capacitor provided on a line that transmits the input signal to a gate terminal of the transistor;
    a gate-ground resistance that is provided between the gate terminal of the transistor and a ground potential; and
    a parallel resistance provided in parallel with the capacitor with respect to the gate terminal of the transistor, wherein
    a product of a capacitance of the capacitor and a resistance value of the parallel resistance is substantially equal to a product of a gate capacitance of the transistor and the gate-ground resistance.

2. An amplifier that amplifies an input signal input thereto, comprising:
    a transistor;
    a capacitor that is provided on a line that transmits the input signal to a gate terminal of the transistor;
    a gate-ground resistance that is provided between the gate terminal of the transistor and a ground potential; and
    a parallel resistance provided in parallel with the capacitor with respect to the gate terminal of the transistor, wherein
    a product of a capacitance of the capacitor and a resistance value of the parallel resistance is substantially equal to a product of a gate capacitance of the transistor and the gate-ground resistance.

3. The distributed amplification apparatus according to claim 1, wherein each amplifier further includes:
    a second transistor whose source terminal is connected to the drain terminal of the transistor and whose drain terminal is connected to the output-side transmission line; and
    a resistance that is provided between a biasing line and the gate terminal of the second transistor.

4. The amplifier according to claim 2, further comprising:
    a second transistor whose source terminal is connected to the drain terminal of the transistor and whose drain terminal is connected to an output-side transmission line; and
    a resistance that is provided between a biasing line and the gate terminal of the second transistor.

* * * * *